(12) United States Patent
Chang

(10) Patent No.: US 10,042,218 B2
(45) Date of Patent: Aug. 7, 2018

(54) LIQUID-CRYSTAL DISPLAY DEVICE

(71) Applicant: Samsung Display Co., Ltd., Yongin-Si, Gyeonggi-Do (KR)

(72) Inventor: Jong Woong Chang, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 147 days.

(21) Appl. No.: 15/212,344

(22) Filed: Jul. 18, 2016

(65) Prior Publication Data

US 2017/0146868 A1 May 25, 2017

(30) Foreign Application Priority Data

Nov. 20, 2015 (KR) ........................ 10-2015-0163170

(51) Int. Cl.
*G02F 1/1343* (2006.01)
*H01L 27/00* (2006.01)
*G09G 3/36* (2006.01)
*G02F 1/1333* (2006.01)
*G02F 1/1362* (2006.01)
*G02F 1/1368* (2006.01)
*H01L 27/12* (2006.01)

(52) U.S. Cl.
CPC ...... *G02F 1/134309* (2013.01); *G02F 1/1368* (2013.01); *G02F 1/13439* (2013.01); *G02F 1/133345* (2013.01); *G02F 1/136227* (2013.01); *G02F 1/136286* (2013.01); *G09G 3/3677* (2013.01); *G09G 3/3688* (2013.01); *H01L 27/124* (2013.01); *H01L 27/1248* (2013.01); *G02F 2201/121* (2013.01); *G02F 2201/123* (2013.01); *G09G 2310/08* (2013.01)

(58) Field of Classification Search
CPC ........ G02F 1/134309; G02F 1/136227; G02F 1/1368; G02F 2201/121; G02F 2201/1238; G09G 3/3688; G09G 3/3648; G09G 3/3233; G09G 2310/08; H01L 27/124; H01L 27/1248; H01L 27/3248
See application file for complete search history.

(56) References Cited

U.S. PATENT DOCUMENTS

| 5,686,932 | A | 11/1997 | Tomita | |
|---|---|---|---|---|
| 6,195,140 | B1 * | 2/2001 | Kubo | ................ G02F 1/133555 349/111 |
| 6,760,081 | B2 | 7/2004 | Takagi | |

(Continued)

FOREIGN PATENT DOCUMENTS

KR 1020150070662 A 6/2015

*Primary Examiner* — Nikolay Yushin
(74) *Attorney, Agent, or Firm* — Cantor Colburn LLP

(57) ABSTRACT

A liquid-crystal display device, including: a first data line and a second data line each lengthwise extended in a first direction and spaced apart from each other, a gate line lengthwise extended in a second direction different from the first direction, the gate line defining: a first region thereof overlapping the first data line, a second region thereof overlapping the second data line and a third region thereof extended between the first region and the second region, and a pixel including a switching element, a first electrode of the switching element being connected to the first data line and a second electrode of the switching element overlapping each of the first to third regions. In the first direction, a width of the third region is smaller than a width of each of the first and second regions.

19 Claims, 8 Drawing Sheets

(56) References Cited

U.S. PATENT DOCUMENTS

| | | | | |
|---|---|---|---|---|
| 6,888,304 B2* | 5/2005 | Sato | ................... | G09G 3/3233 |
| | | | | 313/498 |
| 7,450,190 B2* | 11/2008 | Roh | ................ | G02F 1/133514 |
| | | | | 349/129 |
| 7,573,459 B2 | 8/2009 | Shih et al. | | |
| 2002/0140643 A1* | 10/2002 | Sato | ................... | G09G 3/3233 |
| | | | | 345/76 |

* cited by examiner

[FIG. 1]
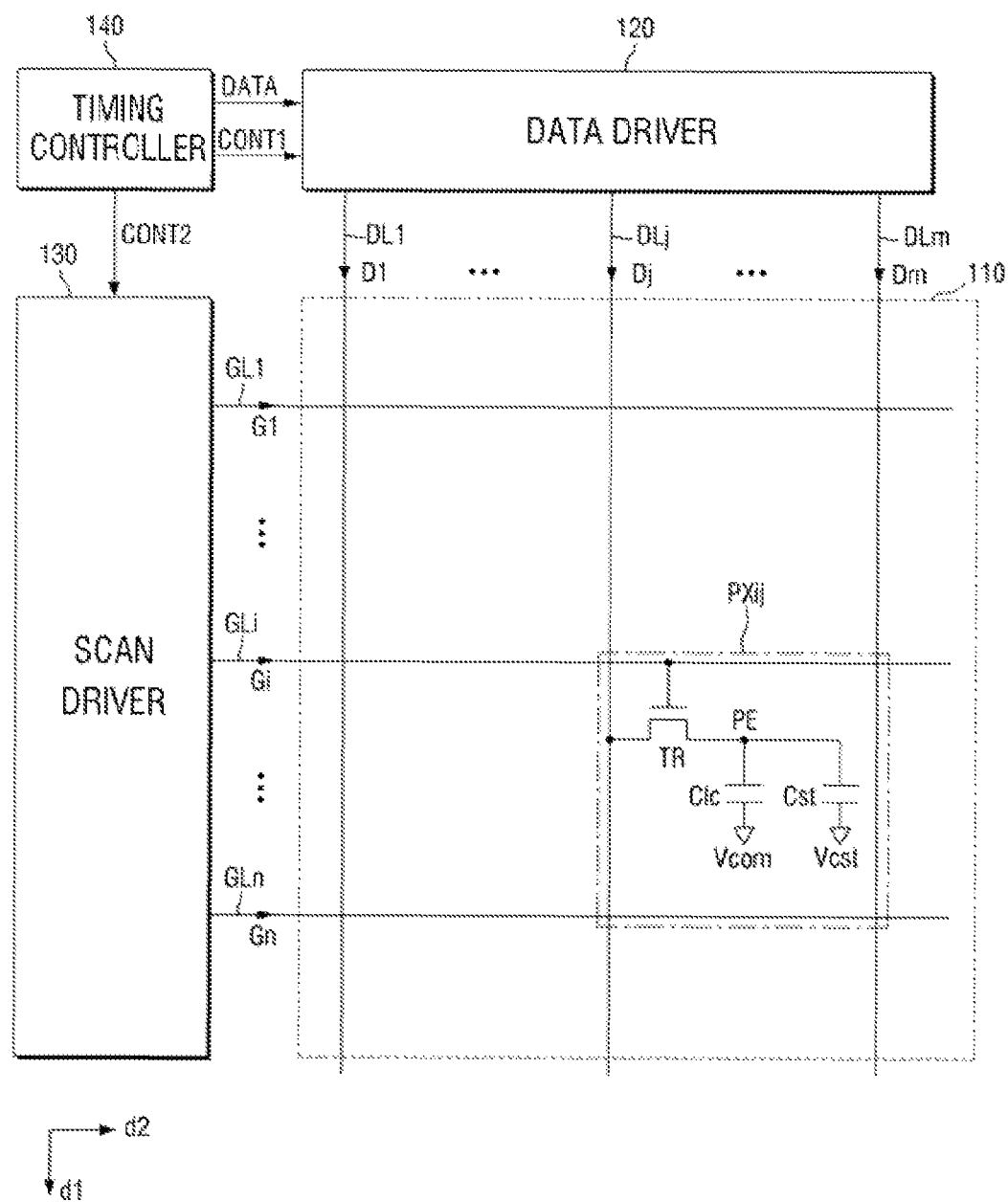

[FIG. 2]
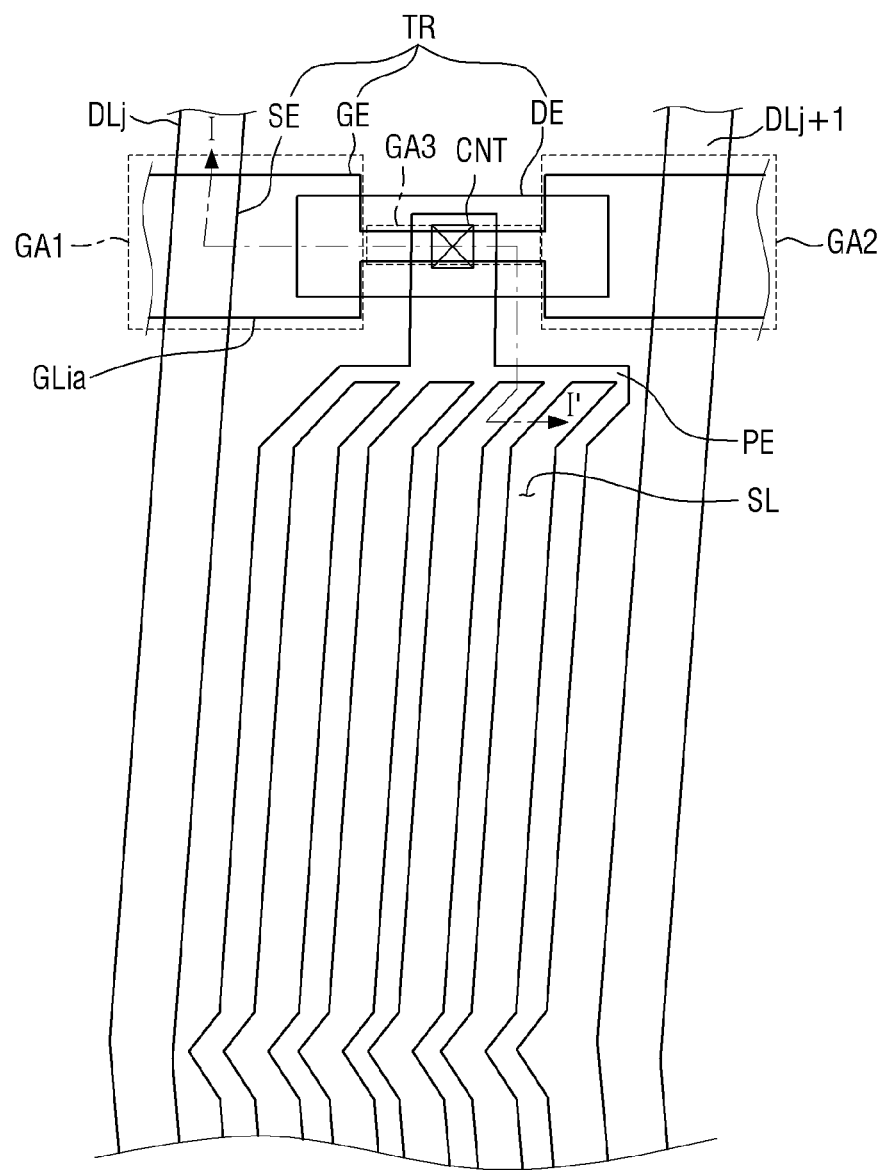

[FIG. 3]
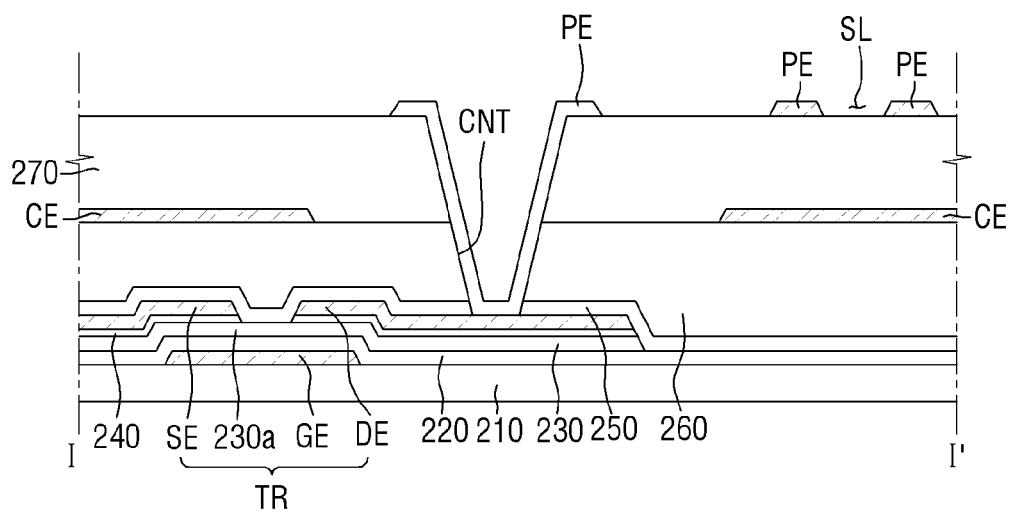

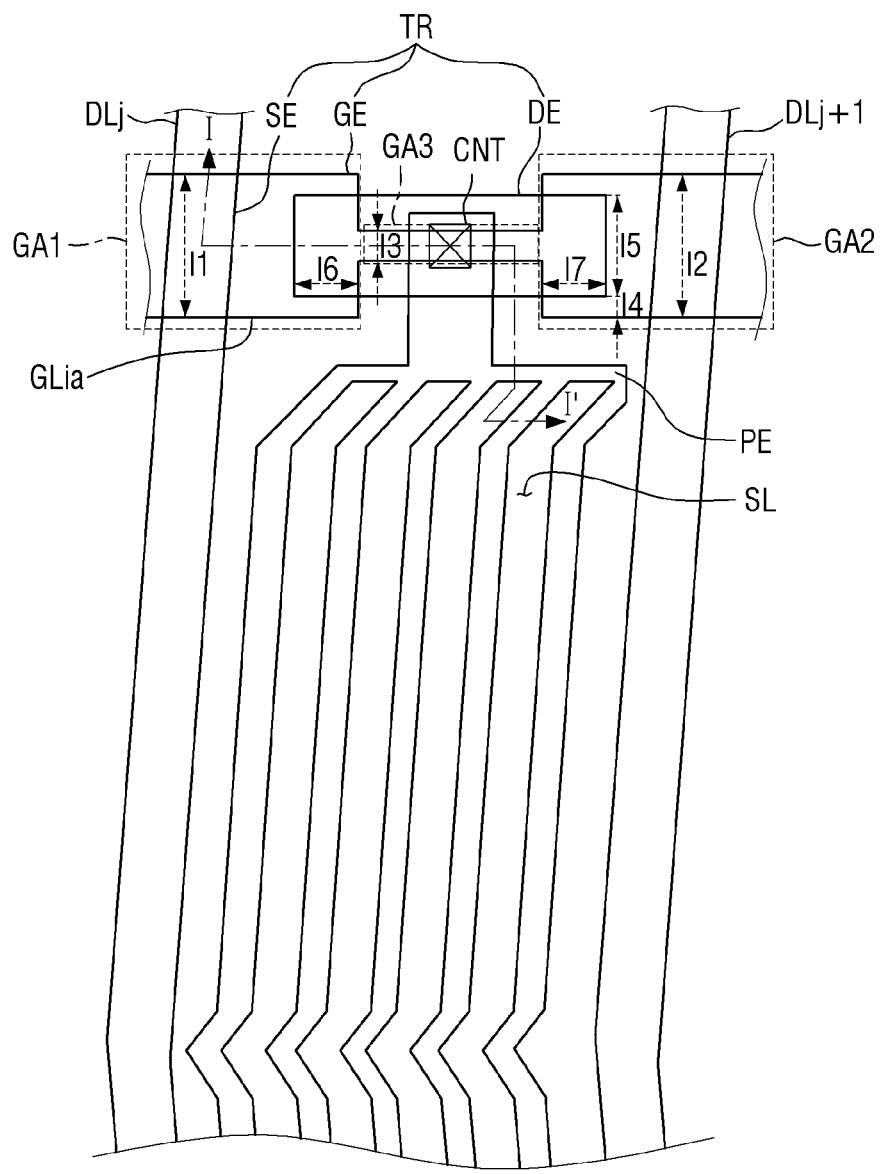
[FIG. 4]

[FIG. 5]
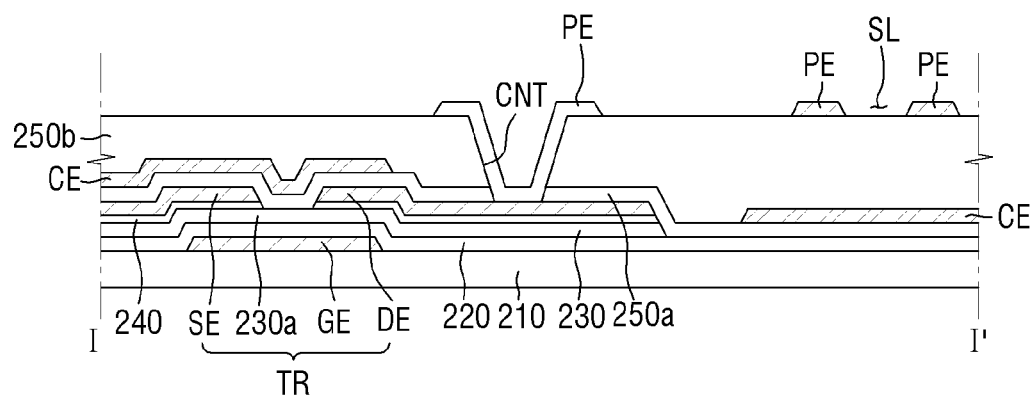

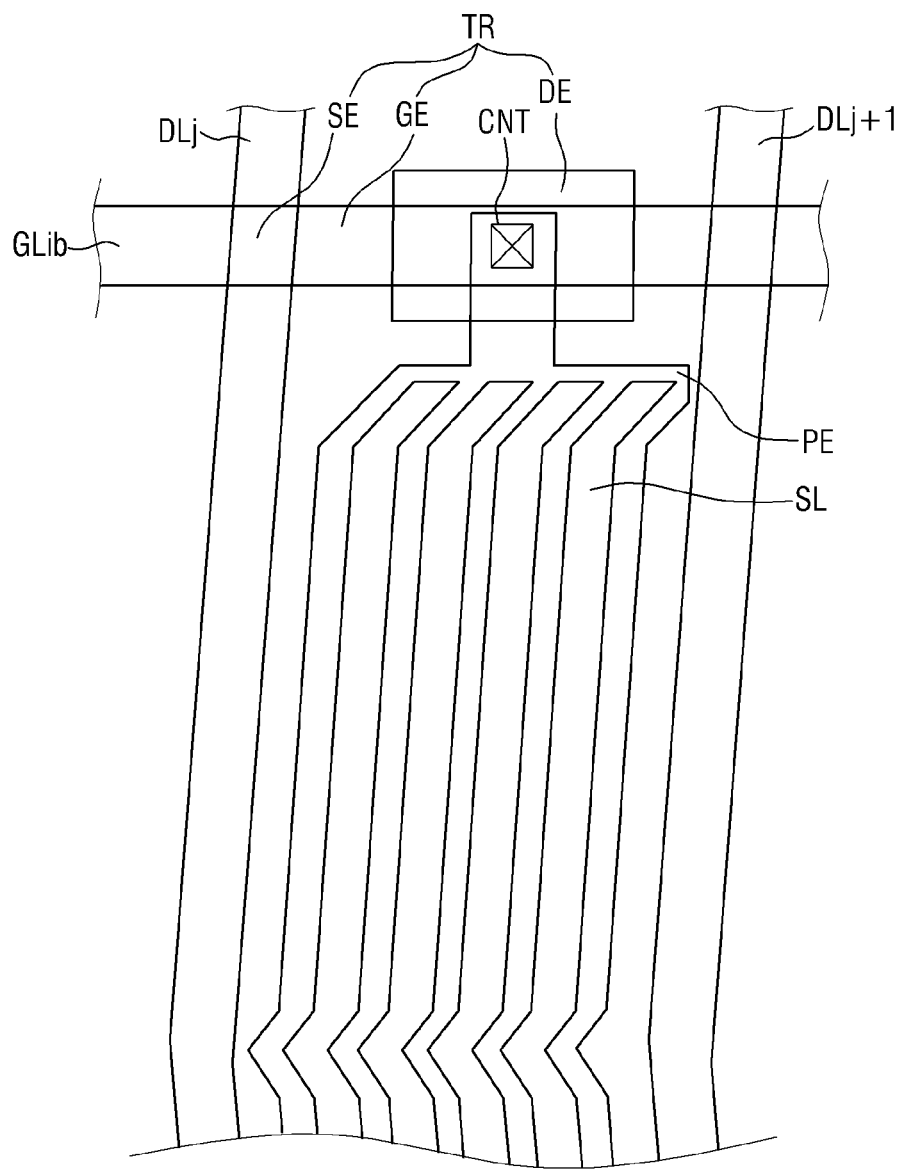
[FIG. 6]

[FIG. 7]
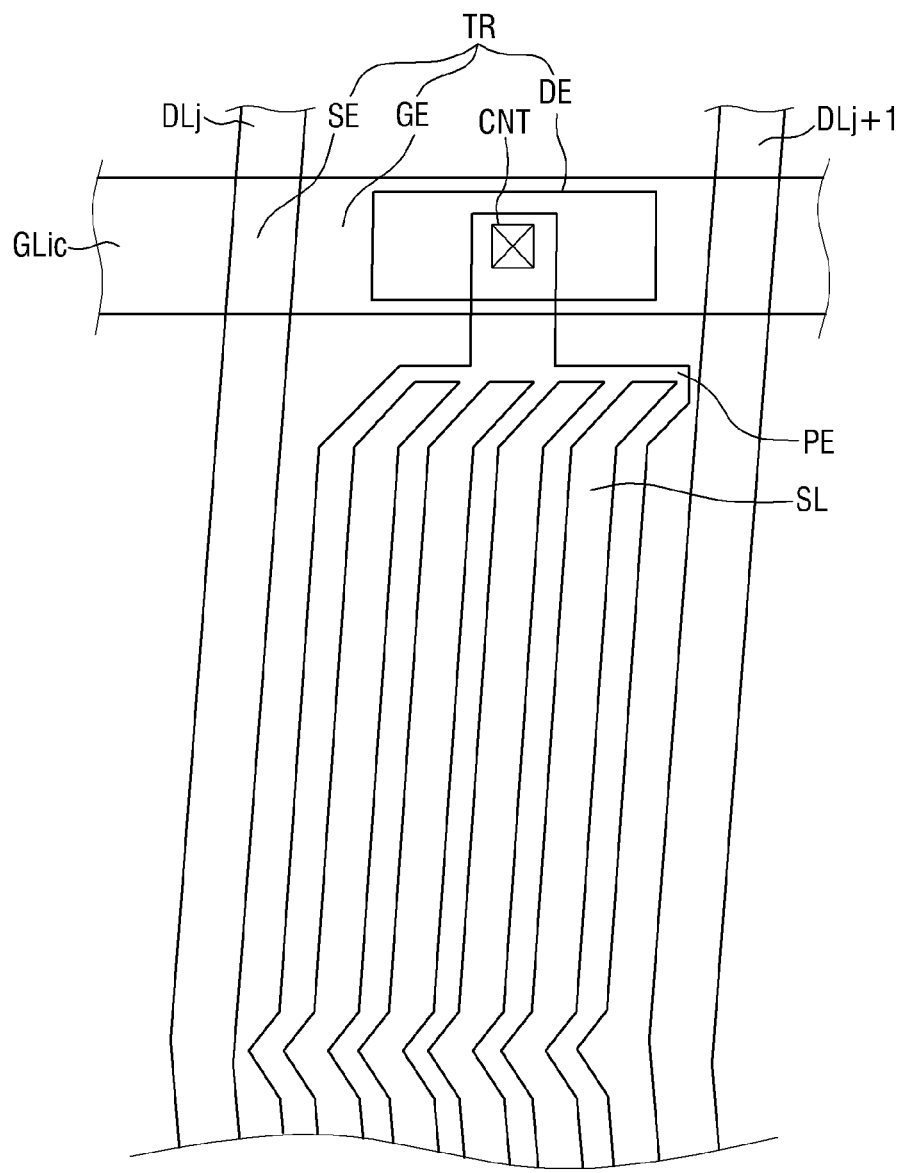

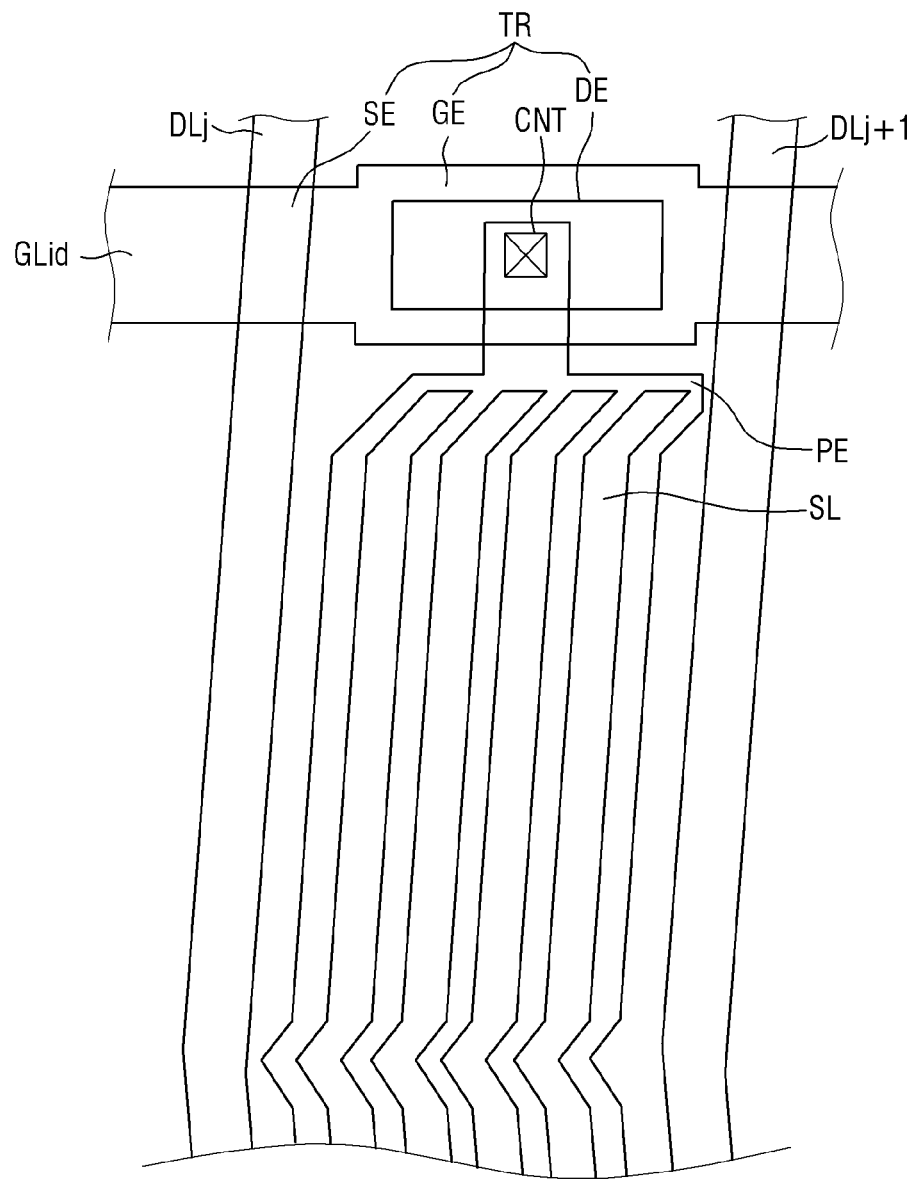
[FIG. 8]

LIQUID-CRYSTAL DISPLAY DEVICE

This application claims priority to Korean Patent Application No. 10-2015-0163170, filed on Nov. 20, 2015, and all the benefits accruing therefrom under 35 U.S.C. §119, the content of which in its entirety is herein incorporated by reference.

BACKGROUND

1. Field

The present disclosure relates to a liquid-crystal display ("LCD") device.

2. Description of the Related Art

Display devices become more and more important as multimedia technology evolves. Accordingly, a variety of types of display devices such as LCD devices and organic light-emitting display ("OLED") devices have been used.

Among these, an LCD device is one of the most commonly used flat display devices. An LCD device includes two substrates in which field generating electrodes such as a pixel electrode and a common electrode are formed, and a liquid-crystal layer disposed therebetween. An LCD device displays an image in such a manner that voltage is applied to the field generating electrodes to generate electric field across the liquid-crystal layer, and liquid-crystal molecules in the liquid-crystal layer are aligned by the electric field so as to control the polarization of incident light.

In an LCD device, a portion of voltage applied to a pixel electrode is charged in a parasite capacitor between a drain electrode and a gate electrode of a switching element connected to the pixel electrode. This is called as kick-back voltage. The kick-back voltage represents a change in voltage applied to the pixel electrode in the transition direction affected by the transition of a gate signal to a switching element connected to the pixel electrode when the gate signal decreases from a high level to a low level.

SUMMARY

One or more exemplary embodiment of the invention provides a liquid-crystal display ("LCD") device in which an area where a gate electrode of a switching element connected to a pixel electrode overlaps a drain electrode of the switching element is maintained from a state before an exposure process to a state after an exposure process in manufacturing the LCD device.

One or more exemplary embodiment of the invention also provides an LCD device for which variation in kick-back voltage is reduced or effectively prevented.

According to an exemplary embodiment of the present disclosure, a liquid-crystal display ("LCD") device is provided, in which an area where a gate electrode of a switching element connected to a pixel electrode overlaps a drain electrode of the switching element does not change from a state before an exposure process to a state after an exposure process in manufacturing the LCD device.

In addition, the variation in the kick-back voltage of the LCD device can be reduced or effectively prevented.

An exemplary embodiment of the invention discloses a liquid-crystal display ("LCD") device, including: a first data line lengthwise extended in a first direction, a second data line lengthwise extended in the first direction, the second data line spaced apart from the first data line, a gate line lengthwise extended in a second direction different from the first direction, the gate line defining in the second direction: a first region thereof overlapping the first data line, a second region thereof overlapping the second data line and a third region thereof extended between the first region and the second region, and a pixel including a switching element, a first electrode of the switching element being connected to the first data line and a second electrode of the switching element overlapping each of the first to third regions. In the first direction, a width of the third region is smaller than a width of each of the first and second regions.

An exemplary embodiment of the invention also discloses a liquid-crystal display ("LCD") device, including: a gate line lengthwise extended in a length direction on a substrate, the gate line having a first width in a width direction perpendicular to the length direction, a data line lengthwise extended in the width direction of the gate line, the data line being insulated from the gate line, a pixel region in which a switching element and a pixel electrode are disposed, the switching element including a first electrode connected to the data line and a second electrode connected to the pixel electrode and overlapping the gate line. In the width direction of the gate line, the second electrode of the switching element which overlaps the gate line has a second width larger than the first width.

An exemplary embodiment of the invention also discloses a liquid-crystal display ("LCD") device, including: a first data line lengthwise extended in a first direction, a second data line lengthwise extended in the first direction, the second data line being spaced apart from the first data line, a gate line lengthwise extended in a second direction different from the first direction, the gate line defining a first region thereof overlapping the first data line, a second region thereof overlapping the second data line and a third region thereof extended between the first region and the second region, and a pixel including a switching element, a first electrode of the switching element being connected to the first data line and a second electrode of the switching element overlapping the gate line. An entirety of the second electrode overlaps the third region. In the first direction, a width of the third region is larger than a width of each of the first and second regions.

BRIEF DESCRIPTION OF THE DRAWINGS

The above and other features of the invention will become more apparent by describing in detail exemplary embodiments thereof with reference to the attached drawings, in which:

FIG. 1 is a block diagram of an exemplary embodiment of a liquid-crystal display ("LCD") device according to the invention;

FIG. 2 is a top plan view showing an exemplary embodiment of a pixel of the LCD device shown in FIG. 1;

FIG. 3 is a cross-sectional view taken along line I-I' of FIG. 2;

FIG. 4 is a diagram showing an exemplary embodiment of relative structures of a gate and data pattern to which an exposure process is applied for forming the pixel shown in FIG. 2;

FIG. 5 is a cross-sectional view taken along line I-I' of FIG. 4;

FIG. 6 is a top plan view showing another exemplary embodiment of relative structures of a gate and data pattern to which an exposure process is applied for forming a pixel of the LCD device shown in FIG. 1;

FIG. 7 is a top plan view showing yet another exemplary embodiment of relative structures of a gate and data pattern to which an exposure process is applied for forming a pixel of the LCD device shown in FIG. 1, and;

FIG. 8 is a top plan view showing still another exemplary embodiment of relative structures of a gate and data pattern to which an exposure process is applied for forming a pixel of the LCD device shown in FIG. 1.

DETAILED DESCRIPTION

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments of the present disclosure will be described with reference to the accompanying drawings.

Although a liquid-crystal display device will be described as an example herein, the invention is not limited thereto. For example, the same or similar features of the present invention may also be applied to an organic light-emitting display device.

FIG. 1 is a block diagram of an exemplary embodiment of a liquid-crystal display ("LCD") device according to the invention.

Referring to FIG. 1, the LCD device may include a display panel 110, a data driver 120, a gate (scan) driver 130 and a timing controller 140.

The display panel 110 generates and displays an image thereon. The display panel 110 may include a lower display substrate, an upper display substrate facing the lower display substrate, and a liquid-crystal layer sandwiched therebetween. That is, the display panel 110 may be a liquid-crystal panel. The display panel 110 is connected to a plurality of gate lines GL1 to GLn which transmits gate signals G1 to Gn, and a plurality of data lines DL1 to DLm which transmits data signals D1 to Dm, where n and m are natural numbers equal to or greater than 1. The gate lines GL1 to GLn and the data lines DL1 to DLm may otherwise be referred to as signal lines. The display panel 110 may include a plurality of pixels, each connected to one of the plurality of gate lines GL1 to GLn, and one of the plurality of data lines DL1 to DLm. The plurality of gate lines GL1 to GLn, the plurality of data lines DL1 to DLm, and the plurality of pixels may be disposed or formed in the lower display substrate of the display panel 110. The lines GL1 to GLn and the data lines DL1 to DLm are insulated from one another within the lower display substrate. The plurality of pixels may be arranged in a matrix, for example. The plurality of data lines DL1 to DLm may be lengthwise extended in a first direction d1 in the lower display substrate, for example. The plurality of gate lines GL1 to GLn may be lengthwise extended in a second direction d2 intersecting the first direction d1. In FIG. 1, the first direction d1 refers to the column direction, and the second direction d2 refers to the row direction.

In the following description, a pixel PXij that is connected to the $i^{th}$ gate line GLi and the jth data line DLj will be described as an example of a pixel among the plurality of pixels. The display panel 110 displays the image at regions of the plurality of pixels. Upon receiving the $i^{th}$ gate signal Gi from the $i^{th}$ gate line GLi, the pixel PXij receives the jth data signal Dj from the jth data line DLj.

The data driver 120 may include a shift register, a latch, a digital-to-analog converter ("DAC"), etc. The data driver 120 may receive a first control signal CONT1 and image data DATA from the timing controller 140. The data driver 120 may select a reference voltage in response to the first control signal CONT1 and may convert the received image data DATA in the form of a digital wave into a plurality of data signals D1 to Dm based on the selected reference voltage. The data driver 120 may provide the generated data signals D1 to Dm to the display panel 110.

The gate driver 130 may receive a second control signal CONT2 from the timing controller 140. The gate driver 130 may provide a plurality of gate signals G1 to Gn to the display panel 110 in response to the received second control signal CONT2.

The timing controller 140 may receive image signals ("R, G and B") and a control signal ("CS") for controlling the image signals, from an external device (not shown). The control signal CS may include, for example, a vertical synchronous signal ("$V_{sync}$"), a horizontal synchronous signal ("$H_{sync}$"), a main clock signal ("MCLK"), a data enable signal, etc. The timing controller 140 may process the various signals received from the external device so that the various signals are suitable for the operating conditions of the display panel 110, and then may generate the image data DATA, the first control signal CONT1 and the second control signal CONT2. The first control signal CONT1 may include a horizontal synchronous threshold signal ("STH") to instruct to input the image data DATA and a load signal ("TP") for controlling application of the data signals D1 to Dm to the data lines DL1 to DLm, etc. The second control signal CONT2 may include a scan start signal ("STV") to instruct to start outputting the gate signals G1 to Gn and a gate clock signal ("CPV") for controlling the output timing of scan-on-pulses, etc.

The pixel PXij may include a switching element TR and a pixel electrode PE. The switching element TR may be a transistor having terminals, for example. Among three terminals, for example, a gate (terminal) electrode of the switching element TR may be connected to the $i^{th}$ gate line GLi, one (terminal) electrode of the switching electrode TR may be connected to the jth data line DLj, and the remaining (terminal) electrode of the switching electrode TR may be connected to the pixel electrode PE. In the following description, the one electrode of the switching element TR is a source electrode while the remaining electrode is a drain electrode.

The switching element TR may be turned on in response to the $i^{th}$ gate signal Gi received from the $i^{th}$ gate line GLi, and may provide the jth data signal Dj received from the jth data line DLj to the pixel electrode PE. The pixel PXij may overlap a common electrode CE of the upper display substrate (see FIG. 3). The pixel PXij may receive a common voltage $V_{com}$ from the common electrode CE (see FIG. 3).

Accordingly, a liquid-crystal capacitor Clc may be formed between or by the pixel electrode PE and the common electrode CE within the pixel PXij. That is, among two terminals of the liquid-crystal capacitor Clc, one (terminal) electrode of the liquid-crystal capacitor Clc may be the pixel electrode PE while the other (terminal) electrode thereof may be the common electrode CE. The liquid-crystal capacitor Clc may be charged with the difference between the voltage applied to the pixel electrode PE and the common voltage $V_{com}$.

In addition, a storage capacitor Cst may be formed between or defined by the pixel electrode PE and a storage line (not shown). The storage capacitor Cst may be charged with the difference between a storage voltage Vcst received from the storage line and the voltage applied to the pixel electrode PE.

FIG. 2 is a top plan view showing an exemplary embodiment of the pixel PXij of the LCD device shown in FIG. 1. A first implementation of the $i^{th}$ gate line GLi of FIG. 1 is indicated by the symbol GLia in FIG. 2.

Referring to FIG. 2, the jth data line DLj and the $(j+1)^{th}$ data line DLj+1 may be disposed lengthwise in the first direction d1, and the $i^{th}$ gate line GLia may be disposed lengthwise in the second direction d2.

The $i^{th}$ gate line GLia may include or define a first region GA1 overlapping the jth data line DLj, and a second region GA2 overlapping the $(j+1)^{th}$ data line DLj+1. In addition, the $i^{th}$ gate line GLia may include a third region GA3 disposed between the first region GA1 and the second region GA2. The above-described regions of the $i^{th}$ gate line GLia are indicated with dotted lines in FIG. 2. Lengths of the various regions GA1, GA2 and GA3 are defined in the second direction d2. Widths of the various regions GA1, GA2 and GA3 are defined in the first direction d1 and may be defined by a maximum distance between edges thereof disposed opposite to each other in the first direction d1.

The width of the third region GA3 may be smaller than that of the first region GA1 and that of the second region GA2. The width of the first region GA1 may be different from the width of the second region GA2 as long as both of these widths are larger than the width of the third region GA3. Specifically, the first region GA1 may have or define a first width 11 (see FIG. 4) and the second region GA2 may have or define a second width 12 (see FIG. 4). In addition, the third region GA3 may have or define a third width 13 (see FIG. 4). In the exemplary embodiment of the LCD device, the third width 13 may be smaller than each of the first width 11 and the second width 12. In addition, the first width 11 may be equal to the second width 12. That is, the first region GA1 and the second region GA2 may be symmetric to each other with respect to the third region GA3.

In one exemplary embodiment, the pixel PXij may be disposed in an area of the display panel 110 defined by the jth data line DLj, the (j+1)$^{th}$ data line DLj+1 and the i$^{th}$ gate line GLi, but the invention is not limited thereto.

The switching element TR may include a gate electrode GE, a source electrode SE and a drain electrode DE. The drain electrode DE is a single, unitary element. Lengths of the various electrodes GE, SE and DE are defined in the second direction d2. Widths of the various electrodes GE, SE and DE are defined in the first direction d1 and may be defined by a maximum distance between edges thereof disposed opposite to each other in the first direction d1.

A portion of the source electrode SE of the switching element TR may overlap the first region GA1 to be connected to the jth data line DLj. More specifically, the switching element TR may use a portion of the jth data line DLj as the source electrode SE. That is, the source electrode SE of the switching element TR may be a portion of the jth data line DLj. Accordingly, the source electrode SE does not extend from the jth data line DLj such that edges or boundaries of the jth data line DLj defines those of the source electrode SE.

The gate electrode GE of the switching element TR may be connected to the i$^{th}$ gate line GLia. More specifically, the switching element TR may use the i$^{th}$ gate line GLia as the gate electrode GE. The i$^{th}$ gate line GLia may be a part of the gate electrode GE. Accordingly, the gate electrode GE does not extend from the i$^{th}$ gate line GLia such that edges or boundaries of i$^{th}$ gate line GLia define those of the gate electrode GE.

As the switching element TR has the source electrode SE thereof integrated with the jth data line DLj, and the gate electrode GE thereof integrated with the i$^{th}$ gate line GLia, the overall area defined or occupied by the switching element TR can be reduced. In addition, as the area of the switching element TR is reduced, the aperture ratio of one or more exemplary embodiment of the LCD device according to the invention can be improved (e.g., not reduced).

The drain electrode DE of the switching element TR may overlap each of the first to third regions GA1 to GA3 of the i$^{th}$ gate line GLia. The width 15 (see FIG. 4) of the drain electrode DE may be larger than the third width 13 of the third region GA3 and smaller than the width 11 of the first region GA1 and the width 12 of the second region GA2. The drain electrode DE of the switching element TR may be connected to the pixel electrode PE via a contact hole CNT. A description thereof will be made below with reference to FIGS. 3 and 4.

FIG. 3 is a cross-sectional view taken along line I-I' of FIG. 2.

The exemplary embodiment of the LCD device according to the invention may include a lower display substrate, an upper display substrate and a liquid-crystal layer sandwiched therebetween. The lower display substrate may face the upper display substrate. For example, the lower display substrate and the upper display substrate may be attached to each other and sealed together. However, only the lower display substrate and elements disposed thereon will be described herein.

Within the lower display substrate, referring to FIGS. 2 and 3, the i$^{th}$ gate line GLia as a portion of the gate electrode GE may be disposed on the lower base substrate 210. The lower base substrate 210 may be, for example, a transparent glass or plastic substrate. The lower display substrate may be otherwise referred to as an array substrate in which a plurality of switching elements is disposed.

Edges or boundaries of the i$^{th}$ gate line GLia defines those the gate electrode GE, and the i$^{th}$ gate line GLia does not include a portion protruding or extending therefrom toward a semiconductor layer 230. For example, the i$^{th}$ gate line GLia may include or be formed as a single-layer, a double-layer or a triple-layer made of a conductive metal selected from the group consisting of aluminum (Al), copper (Cu), molybdenum (Mo), chrome (Cr), titanium (Ti), tungsten (W), molybdenum-tungsten (MoW), molybdenum-titanium (MoTi) and copper/molybdenum-titanium (Cu/MoTi).

A gate insulation film 220 may be disposed on the i$^{th}$ gate line GLia and the gate electrode GE. The gate insulation film 220 may include or be made of, for example, silicon nitride (SiN$_x$) or silicon oxide (SiO$_x$). The gate insulation film 220 may have a multi-layer structure including at least two insulation layers having different physical properties from each other.

The semiconductor layer 230 may be disposed on the gate insulation film 220. The semiconductor layer 230 may include or be made of amorphous silicon, polycrystalline silicon, etc. Alternatively, the semiconductor layer 230 may include or be made of a semiconductor oxide selected from the group consisting of IGZO (In—Ga—Zinc-Oxide), ZnO, ZnO$_2$, CdO, SrO, SrO$_2$, CaO, CaO$_2$, MgO, MgO$_2$, InO, In$_2$O$_2$, GaO, Ga$_2$O, Ga$_2$O$_3$, SnO, SnO$_2$, GeO, GeO$_2$, PbO, Pb$_2$O$_3$, Pb$_3$O$_4$, TiO, TiO$_2$, Ti$_2$O$_3$, and Ti$_3$O$_5$. The semiconductor layer 230 may extend in the second direction d2 to overlap the jth data line DLj and the (j+1)$^{th}$ data line DLj+1. In addition, in an exemplary embodiment where the plurality of data lines, the drain electrode DE and the source electrode SE and the semiconductor layer 230 are formed together via the same process using a single mask to be disposed in a same layer of the lower display substrate, the semiconductor layer 230 may be disposed under (e.g., closer to the lower base substrate 210 than) other elements of the lower display substrate. That is, the semiconductor layer 230 may have substantially the same shape as the plurality of data lines, except for a channel region of the switching element TR. The semiconductor layer 230 may include or define a semiconductor pattern 230a thereof that forms a portion of the switching element TR. The semiconductor pattern 230a overlaps the gate electrode GE and is exposed between the source and drain electrodes SE and DE at the channel region.

An ohmic contact layer 240 may be disposed on the semiconductor layer 230. The ohmic contact layer 240 may include or be made of a material relatively highly doped with an n-type impurity such as phosphorus, e.g., n+ hydrogenated amorphous silicon, or may include or be made of silicide. The ohmic contact layer 240 may be omitted depending on the type of the material of the semiconductor layer 230.

The jth data line DLj, the (j+1)$^{th}$ data line DLj+1, the drain electrode DE and the source electrode SE may be disposed on (e.g., above) the ohmic contact layer 240. The jth data line DLj, the (j+1)$^{th}$ data line DLj+1, the drain electrode DE and the source electrode SE may include or be formed as a single-layer, a double-layer or a triple-layer made of a conductive metal selected from the group consisting of aluminum (Al), copper (Cu), molybdenum (Mo), chrome (Cr), titanium (Ti), tungsten (W), molybdenum-tungsten (MoW), molybdenum-titanium (MoTi) and copper/molybdenum-titanium (Cu/MoTi). However, the material for the aforementioned signal lines and electrodes are not limited to those listed above but may include a variety of metals or conductors.

The source electrode SE may be a portion of the jth data line DLj to supply the jth data signal Dj to the drain electrode DE. The drain electrode DE may be connected to the pixel electrode PE via the contact hole CNT. The drain electrode DE may contact the pixel electrode PE at the contact hole CNT. A portion of each of the source electrode SE and the drain electrode DE may overlap the gate electrode GE. The source electrode SE and the drain electrode DE may be disposed in a same layer of the lower display substrate among layers thereof disposed on the lower base substrate 210 and spaced apart from each other by a predetermined distance.

As such, the switching element TR may include the gate electrode GE, the semiconductor pattern 230a, the drain electrode DE and the source electrode SE. The switching element TR may receive the jth data signal Dj from the source electrode SE and may supply the jth data signal Dj to the pixel electrode PE via the drain electrode DE in contact therewith at the contact hole CNT.

A first passivation film 250 may be disposed on the drain electrode DE and the source electrode SE above the gate insulation film 220. The first passivation film 250 may include or be made of an inorganic insulation material such as silicon nitride, silicon oxide, etc.

An organic insulation film 260 may be disposed on the first passivation film 250 to expose a portion of the drain electrode DE. The organic insulation film 260 may include a photosensitive material. In manufacturing the LCD device, if the organic insulation film 260 includes a photosensitive material, no additional photoresist is required during a process of patterning the organic insulation film 260 for forming the contact hole CNT, for example, and thus the manufacturing process efficiency can be improved.

The common electrode CE may be disposed on the organic insulation film 260. A portion of the common electrode CE may overlap the pixel electrode PE. The common electrode CE, along with the pixel electrode PE, may generate electric field so as to control orientations of liquid crystal molecules in the liquid-crystal layer interposed between the lower display substrate and the upper display substrate. Referring to FIG. 3, for example, the liquid-crystal layer may be disposed above the pixel electrode PE and remaining elements of the lower display substrate. The common electrode CE may include or be made of a transparent conductive material such as indium tin oxide ("ITO"), indium zinc oxide ("IZO"), etc. Although the common electrode CE is disposed extended substantially over an entirety of the lower base substrate 210, an opening that is aligned with and is larger than the contact hole CNT in the top plan view may be defined in the common electrode CE, in order to avoid forming a short-circuit with the pixel electrode PE disposed extended into the contact hole CNT.

The second passivation film 270 may be disposed on the common electrode CE. The second passivation film 270 may include or be made of an inorganic insulation material such as silicon nitride, silicon oxide, etc.

The pixel electrode PE may be disposed on the second passivation film 270. The pixel electrode PE may include or be made of a transparent conductive material such as indium tin oxide ("ITO"), indium zinc oxide ("IZO"), etc. The pixel electrode PE may overlap a portion of the common electrode CE. That is, the pixel electrode PE may overlap a portion of the common electrode CE in the direction perpendicular to the lower base substrate 210, thereby forming a horizontal electric field within the lower display substrate. The pixel electrode PE may be insulated from the common electrode CE by the second passivation film 270.

The pixel electrode PE may include or define a slit SL provided in plural. The plurality of slits SL may generate a fringe field between the pixel electrode PE and the common electrode CE so as to facilitate the liquid-crystal molecules of the liquid-crystal layer to rotate in a particular direction. Referring to FIG. 2, the slits SL of the pixel electrode PE may be, for example, extended lengthwise in substantially the same direction as the direction in which the jth data line DLj and the $(j+1)^{th}$ data line DLj+1 are extended, and may be bent at a center thereof (bottom of FIG. 2) to make an obtuse angle of portions thereof meeting at the center. The pixel electrode PE may be divided into different domains with respect to the bent portion. The slit shape and domains of the pixel electrode PE are not limited to that shown in FIG. 2. In exemplary embodiments of the LCD device, a variety of shapes and domains related to the pixel electrode PE may be formed.

Although not shown in the drawings, a lower alignment film (not shown) may be disposed on the pixel electrode PE. The lower alignment film may include or be made of polyimide or the like, and may be disposed or formed over an entire surface of a display area of the LCD device at which the pixel electrode PE is formed. The lower alignment film may be disposed between the pixel electrode PE and the liquid-crystal layer (not shown) thereabove.

Although not shown in the drawings, the upper display substrate may face the lower display substrate including layers thereof on the lower base substrate 210. The upper display substrate may include an upper base substrate on which layers of the upper display substrate are disposed. The upper base substrate may include or be made of transparent glass, plastic, etc., and in an exemplary embodiment may include or be made of the same material as the lower base substrate 210.

Within the upper display substrate, a black matrix (not shown) may be disposed on the upper base substrate so as to block light from passing through areas thereof other than areas at pixels of the LCD device. In addition, a color filter ("CF") may be disposed on the black matrix within the upper display substrate. The color filter may be formed within the upper display substrate to correspond to the pixels defined by the black matrix. For example, the color filter may display one of red color R, green color G and blue color B. In addition, an overcoat layer (not shown) and an upper alignment film (not shown) may be disposed or formed within the upper display substrate such as on the upper base substrate thereof. The overcoat layer covers the color filter and the black matrix to provide a flat surface within the upper display substrate.

FIG. 4 is a diagram showing an exemplary embodiment of relative structures of a gate and data pattern to which an exposure process is applied for forming the pixel shown in FIG. 2. Specifically, FIG. 4 shows relative structures of a gate and data pattern before performing an exposure process for forming the pixel shown in FIG. 2. In an exemplary embodiment of a method of manufacturing the LCD device, a mask pattern for forming elements of the pixel is designed in consideration of the underlying gate and data patterns of the lower display substrate having the relative structures illustrated in FIG. 4. For convenience of illustration, it is assumed that the configuration of the layers in FIG. 2 is the same before and after the exposure process.

Referring to FIG. 4, the $i^{th}$ gate line GLia may include the first region GA1 overlapping the jth data line DLj, and the second region GA2 overlapping the $(j+1)^{th}$ data line DLj+1. In addition, the $i^{th}$ gate line GLia may include a third region GA3 disposed between the first region GA1 and the second region GA2. The drain electrode DE of the switching element TR may overlap each of the first to third regions GA1 to GA3 of the $i^{th}$ gate line GLia. In one or more exemplary embodiment, as a result of the shape and/or configuration of the drain electrode DE and the $i^{th}$ gate line GLia, even if there is process variation in the exposure process, the overlapping planar area where the drain electrode DE overlaps the gate electrode GE can be maintained from a state before the exposure process to a state after the exposure process. In exemplary embodiments, a total overlapping planar area defined by a sum of the planar areas of the drain electrode DE which overlap the respective portions of the $i^{th}$ gate line GLia is maintained from a state before the exposure process to a state after the exposure process.

Previously in a conventional LCD device, if there is process variation during an exposure process during manufacturing of the LCD device, the planar area defined by the gate electrode overlapping the drain electrode of a switching element electrically connected to a pixel electrode after the exposure process, may be dislocated or may deviate from the planar area defined before the exposure process. When this happens, a kick-back voltage may vary, which is defined as a voltage charged in a parasite capacitor depending on the overlapping planar area where the gate electrode overlaps the drain electrode of the switching element. Such variation in the kick-back voltage may undesirably result in flickering or afterimage problems throughout the LCD device.

In order to overcome such problems, in one or more exemplary embodiment of the LCD device according to the invention, the $i^{th}$ gate line GLia includes or defines the third region GA3 disposed between the first region GA1 and the second region GA2 which oppose each other in the second direction d2. As the drain electrode DE of the switching element TR overlaps each of the first to third regions GA1 to GA3, the overlapping planar area defined by the gate electrode overlapping the drain electrode of the switching element does not change from a state before the exposure process to a state after the exposure process even if there is process variation during the exposure process. By doing so, the variation in the kick-back voltage can be reduced or effectively prevented.

Referring to FIG. 4, for example, the width 15 of the drain electrode DE of the switching element TR is designed to be smaller than the widths 11 and 12 of the first and second regions GA1 and GA2, respectively, and larger than the width 13 of the third region GA3, so that the overlapping planar area defined by the drain electrode DE overlapping the $i^{th}$ gate line GLia does not change from a state before the exposure process to a state after the exposure process even if the drain electrode DE and the $i^{th}$ gate line GLia are dislocated due to process variation. In addition, as long as the overlapping planar area where the drain electrode DE overlaps the $i^{th}$ gate line GLia does not change, the length 16 by which the gate electrode GE overlaps the drain electrode DE in the first region GA1 may be equal to or different from the length 17 by which the gate electrode GE overlaps the drain electrode DE in the second region GA2. The lengths 16 and 17 may indicate an entirety of the length of the drain electrode DE in the first and second regions GA1 and GA2 of the $i^{th}$ gate line GLia.

Referring to FIG. 4, for example, overlapping planar areas of the drain electrode DE may defined by a first region planar area (width 15 multiplied by length 16), a second region planar area (width 15 multiplied by length 17) and a third region planar area (width 13 multiplied by an entirety of the length of the $i^{th}$ gate line GLia in the third region GA3.

More specifically, when the first width 11 of the first region GA1 of the $i^{th}$ gate line GLia is substantially equal to the second width 12 of the second region GA2, a total difference between the first width 11 and the width 15 of the drain electrode DE may be about 2 micrometers (μm) to about 3 μm. In particular, when the drain electrode DE of the switching element TR is disposed at the center of each the first and second regions GA1 and GA2 of the $i^{th}$ gate line GLia in the width direction (e.g., first direction d1), the distance 14 from an edge of the drain electrode DE in the width direction to an edge of the $i^{th}$ gate line GLia at the first region GA1 in the width direction may be about 1 μm to about 1.5 μm.

FIG. 5 is a cross-sectional view taken along line I-I' of FIG. 4. The elements already described above with respect to FIG. 3 will not be described again. For purposes of description only, the structure of FIG. 5 may be considered as a modified exemplary embodiment of the structure of FIG. 3 for which the organic insulation film 260 has been omitted. The manufacturing process described below with reference to FIG. 5 may be applicable to the structure illustrated in FIG. 3.

Referring to FIG. 5, the common electrode CE may be disposed on the first passivation film material layer 250a. The first passivation film material layer 250a may be disposed over an entirety of the underlying layers in the state before the exposure process. As described above, the first passivation film material layer 250a may include be made of an inorganic insulation material such as silicon nitride, silicon oxide, etc. In an exemplary embodiment, the first passivation film material layer 250a may have a thickness of about 2,000 Å to about 4,000 Å, such as defined in a third direction orthogonal to both the first and second directions d1 and d2.

Subsequently, a second passivation film material layer 250b may be disposed on the common electrode CE. The second passivation film material layer 250b may be disposed over an entirety of the underlying layers in the state before the exposure process. In an exemplary embodiment, the second passivation film material layer 250b and the first passivation film material layer 250a may include or be made of the same material. That is, in the alternative exemplary embodiment of the present invention shown in FIG. 5, an LCD device does not include the organic insulation film 260 shown in FIG. 3. Although the top surface of the second passivation film material layer 250b on which pixel electrodes PE are disposed is an even (e.g., flat) surface in FIG. 5 for convenience of illustration, this is not limiting. Alternative to the structure shown in FIG. 5, for example, the thickness of the second passivation film material layer 250b may be similar to the thickness of the first passivation film material layer 250a.

In an exemplary embodiment, the second passivation film material 250b may have a thickness of about 2,000 Å to about 4,000 Å. Accordingly, the LCD device shown in FIG. 5 does not include an organic insulation film (260 in FIG. 3) having a thickness of about 3 μm to about 4 μm. As no process of forming an additional organic insulation film is necessary when the LCD device shown in FIG. 5 does not include an organic insulation film, the fabricating process can be simpler, realizing benefit in terms of cost.

The second passivation film material layer 250b and the first passivation film material layer 250a having the contact hole CNT defined therein may define a second passivation film and a first passivation film of the lower display substrate.

It should be understood that for forming the pixel structure in FIG. 3 by an exposure process, a second passivation film material layer 250b, an organic insulation film material layer and a first passivation film material layer 250a may be disposed on the lower base substrate 210, and the exposure process may be performed to respectively form the second passivation film 260, the organic insulation film 260 and the first passivation film 250 of the lower display substrate.

The pixel electrode PE may be disposed on the second passivation film material layer 250b through which the contact hole CNT is defined. At the contact hole CNT, an exposed portion of the drain electrode DE may be electrically connected to the pixel electrode PE.

FIG. 6 is a to plan view showing another exemplary embodiment of relative structures of a gate and data pattern to which an exposure process is applied for forming a pixel of the LCD device shown in FIG. 1, from which a mask pattern is designed. FIG. 7 is a top plan view showing yet another exemplary embodiment of relative structures of a gate and data pattern to which an exposure process is applied for forming a pixel of the LCD device shown in FIG. 1, from which a mask pattern is designed. FIG. 8 is a top plan view showing still another exemplary of relative structures of a gate and data pattern to which an exposure process is applied for forming a pixel of the LCD device shown in FIG. 1, from which a mask pattern is designed. The elements already described above with respect to FIGS. 2 to 4 will not be described again. In the following description, a second implementation of the $i^{th}$ gate line GLi of FIG. 1 is indicated by the symbol GLib in FIG. 6, a third implementation of the $i^{th}$ gate line GLi of FIG. 1 is indicated by the symbol GLic in FIG. 7, and a fourth implementation of the $i^{th}$ gate line GLi of FIG. 1 is indicated by the symbol GLid in FIG. 8.

Referring to FIG. 6, before an exposure process is performed, the $i^{th}$ gate line GLib having a constant width may be formed on the lower base substrate 210. In this example, the width of the $i^{th}$ gate line GLib may be smaller than the width of the drain electrode DE. The maximum width of the $i^{th}$ gate line GLib may be smaller than that of the drain electrode DE. That is, the drain electrode DE may be extended beyond both of opposing edges of the $i^{th}$ gate line GLib in the width direction. As a result, even if there is process variation during the exposure process, the planar area defined by the drain electrode DE overlapping the $i^{th}$ gate line GLib does not change from a state before the exposure process to a state after the exposure process. Accordingly, the kick-back voltage, which may vary depending on the area where the drain electrode DE overlaps the $i^{th}$ gate line GLib after the exposure process, may not change, either. In addition, the planar area defined by the gate electrode GE overlapping the drain electrode DE of the switching element TR is reduced compared to the examples shown in FIGS. 2 to 4. Accordingly, the capacitance of the parasite capacitor resulted therefrom can be reduced. In addition, the coupling between the $i^{th}$ gate line GLib and each of the data lines DLj and DLj+1 can be reduced.

Referring to FIG. 7, before an exposure process is performed, the width of the $i^{th}$ gate line GLic has a constant width which is larger than the width of the drain electrode DE. The maximum width of the $i^{th}$ gate line GLic may be larger than that of the drain electrode DE. Accordingly, opposing edges of the drain electrode DE in the width direction are disposed at inner sides of the $i^{th}$ gate line GLic in the width direction and the drain electrode DE is completed covered by the $i^{th}$ gate line GLic in the top plan view.

Referring to FIG. 8, before an exposure process is performed, the width of the $i^{th}$ gate line GLid is larger at a position where the drain electrode DE is disposed than where the data lines DLj and DLj+1 are disposed. Also in FIG. 8, similar to FIG. 7, opposing edges of the drain electrode DE in the width direction are disposed at inner sides of the $i^{th}$ gate line GLid in the width direction and the drain electrode DE is completed covered by the $i^{th}$ gate line GLid in the top plan view.

That is, the mask pattern for forming the pixel may be designed based on the relative structures of the gate and the data pattern shown in FIGS. 6, 7 and 8, so that the planar area where the gate electrode GE of the switching element TR overlaps the drain electrode DE thereof is maintained from before the exposure process to after the exposure process.

As a result, even if there is process variation during an exposure process, the planar area defined by the gate electrode GE of the switching element TR overlapping the drain electrode DE thereof does not change. By doing so, the variation in the kick-back voltage within the LCD device can be reduced or effectively prevented.

Although exemplary embodiments of the present disclosure have been described with reference to the accompanying drawings, those skilled in the art would understand that various modifications and alterations may be made without departing from the technical idea or essential features of the present disclosure. Therefore, it should be understood that the above-mentioned embodiments are not limiting but illustrative in all aspects.

What is claimed is:

1. A liquid-crystal display device, comprising:
 a first data line lengthwise extended in a first direction;
 a second data line lengthwise extended in the first direction, the second data line spaced apart from the first data line;
 a gate line lengthwise extended in a second direction different from the first direction, the gate line defining arranged in the second direction:
  a first region thereof overlapping the first data line,
  a second region thereof overlapping the second data line, and
  a third region thereof extended between the first region and the second region; and
 a pixel comprising a switching element, a first electrode of the switching element being connected to the first data line and a second electrode of the switching element which overlaps each of the first to third regions of the gate line,
 wherein
 in the first direction, a width of the third region of the gate line is smaller than a width of each of the first and second regions of the gate line, and
 for the second electrode of the switching element which overlaps each of the first to third regions of the gate line, in the first direction, a width of the second electrode is larger than the width of the third region and is smaller than the width of each of the first and second regions.

2. The liquid-crystal display device of claim 1, wherein for the gate line of which each of the first to third regions thereof is overlapped by the second electrode of the switching element, in the first direction, the width of the first region of the gate line is equal to the width of the second region of the gate line.

3. The liquid-crystal display device of claim 1, wherein for the second electrode of the switching element which overlaps each of the first to third regions of the gate line, a difference between the width of the first region or the second region and the width of the second electrode ranges from about 2 micrometers to about 3 micrometers.

4. The liquid-crystal display device of claim 1, wherein for the second electrode of the switching element which overlaps each of the first to third regions of the gate line, a length in the second direction by which the second electrode overlaps the first region or a length in the second direction by which the second electrode overlaps the second region ranges from about 1 micrometer to about 1.5 micrometers.

5. The liquid-crystal display device of claim 1, wherein the pixel further comprises a pixel electrode electrically connected to the second electrode of the switching element which overlaps each of the first to third regions of the gate line, at a contact hole which overlaps the third region of the gate line.

6. The liquid-crystal display device of claim 5, further comprising:
a first passivation film disposed on the first and second electrodes of the switching element;
a common electrode disposed on the first passivation film; and
a second passivation film disposed on the common electrode,
wherein the pixel electrode overlaps the common electrode on the second passivation film.

7. The liquid-crystal display device of claim 5, further comprising:
a first passivation film disposed on the first and second electrodes of the switching element;
an organic insulation film disposed on the first passivation film;
a common electrode disposed on the organic insulation film; and
a second passivation film disposed on the common electrode,
wherein the pixel electrode overlaps the common electrode on the second passivation film.

8. A liquid-crystal display device, comprising:
a gate line lengthwise extended in a length direction thereof on the substrate, the gate line having a first width in a width direction perpendicular to the length direction;
a data line lengthwise extended in the width direction of the gate line, the data line being insulated from the gate line;
a pixel region in which a switching element and a pixel electrode are disposed, the switching element comprising a first electrode connected to the data line and a second electrode connected to the pixel electrode and overlapping the gate line,
wherein
in the width direction of the gate line, the second electrode of the switching element which overlaps the gate line has a second width larger than the first width of the gate line,
the second electrode of the switching element comprises a first region which is not overlapped the gate line, a second region which is overlapped the gate line, and third region which is not overlapped the gate line, and
the second region is disposed between the first region and the second region.

9. The liquid-crystal display device of claim 8, wherein the gate line defines a gate electrode of the switching element.

10. The liquid-crystal display device of claim 8, wherein for the second electrode of the switching element which has the second width and overlaps the gate line having the first width, a difference between the second width and the first width ranges from about 2 micrometers to about 3 micrometers.

11. The liquid-crystal display device of claim 8, wherein the pixel electrode is electrically connected to the second electrode of the switching element at a contact hole which overlaps the gate line.

12. The liquid-crystal display device of claim 8, further comprising:
a first passivation film disposed on the first and second electrodes of the switching element;
a common electrode disposed on the first passivation film; and
a second passivation film disposed on the common electrode,
wherein the pixel electrode overlaps the common electrode on the second passivation film.

13. The liquid-crystal display device of claim 8, further comprising:
a first passivation film disposed on the first and second electrodes of the switching element;
an organic insulation film disposed on the first passivation film;
a common electrode disposed on the organic insulation film; and
a second passivation film disposed on the common electrode,
wherein the pixel electrode overlaps the common electrode on the second passivation film.

14. A liquid-crystal display device, comprising:
a first data line lengthwise extended in a first direction;
a second data line lengthwise extended in the first direction, the second data line spaced apart from the first data line;
a gate line lengthwise extended in a second direction different from the first direction, the gate line defining arranged in the second direction:
a first region thereof overlapping the first data line,
a second region thereof overlapping the second data line, and
a third region thereof extended between the first region and the second region; and
a pixel comprising a switching element, a first electrode of the switching element being connected to the first data line and a second electrode of the switching element which overlaps the gate line,
wherein
in the first direction, a width of the third region of the gate line is larger than a width of each of the first and second regions of the gate line, and
an entirety of the second electrode is overlapped by the width of the third region which is larger than the width of each of the first and second regions of the gate line.

15. The liquid-crystal display of claim 14, wherein for the second electrode of the switching element for which the entirety thereof overlaps the third region of the gate line, in the first direction, a width of the second electrode is smaller than the width of the third region of the gate line and is larger than the width of each of the first and second regions of the gate line.

16. The liquid-crystal display device of claim 14, wherein the pixel further comprises a pixel electrode electrically connected to the second electrode of the switching element for which the entirety thereof overlaps the third region of the gate line, at a contact hole which overlaps the third region of the gate line.

17. The liquid-crystal display device of claim 14, wherein the gate line defines a gate electrode of the switching element.

18. The liquid-crystal display device of claim 14, further comprising:
- a first passivation film disposed on the first and second electrodes of the switching element;
- a common electrode disposed on the first passivation film;
- a second passivation film disposed on the common electrode; and
- a pixel electrode disposed on the second passivation film, wherein the pixel electrode overlaps the common electrode.

19. The liquid-crystal display device of claim 14, further comprising:
- a first passivation film disposed on the first and second electrodes of the switching element;
- an organic insulation film disposed on the first passivation film;
- a common electrode disposed on the organic insulation film;
- a second passivation film disposed on the common electrode; and
- a pixel electrode disposed on the second passivation film, wherein the pixel electrode overlaps the common electrode.

* * * * *